United States Patent
Van Brunt et al.

(10) Patent No.: US 11,057,033 B2
(45) Date of Patent: Jul. 6, 2021

(54) HYBRID POWER MODULE

(71) Applicant: Cree, Inc., Durham, NC (US)

(72) Inventors: Edward Robert Van Brunt, Raleigh, NC (US); Adam Barkley, Durham, NC (US); Sei-Hyung Ryu, Cary, NC (US); Zachary Cole, Summers, AR (US); Kraig J. Olejniczak, Rogers, AR (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/504,908

(22) Filed: Jul. 8, 2019

(65) Prior Publication Data
US 2020/0412359 A1    Dec. 31, 2020

Related U.S. Application Data

(60) Provisional application No. 62/866,252, filed on Jun. 25, 2019.

(51) Int. Cl.
*H03K 17/567* (2006.01)
*H03K 17/693* (2006.01)
(Continued)

(52) U.S. Cl.
CPC ....... *H03K 17/567* (2013.01); *H01L 29/1608* (2013.01); *H03K 17/62* (2013.01); *H03K 17/693* (2013.01); *H03K 17/76* (2013.01)

(58) Field of Classification Search
CPC .... H03K 17/567; H03K 17/693; H03K 17/76; H03K 17/62; H01L 29/1608
See application file for complete search history.

(56) References Cited

U.S. PATENT DOCUMENTS 5,889,663 A * 3/1999 Tabata ............... H02M 3/1584
                                                    363/56.03
7,741,883 B2 * 6/2010 Fuller ................ H03K 17/284
                                                    327/108
(Continued)

FOREIGN PATENT DOCUMENTS

JP    H04354156 A     12/1992
WO    2016162987 A1   10/2016

OTHER PUBLICATIONS

Cree CAS100H12AM1 datasheet, 2014, Cree, Inc. (Year: 2014).*
(Continued)

*Primary Examiner* — Thomas J. Hiltunen
(74) *Attorney, Agent, or Firm* — Withrow & Terranova, P.L.L.C.

(57) ABSTRACT

A power module includes a plurality of power semiconductor devices. The plurality of power semiconductor devices includes an insulated gate bipolar transistor (IGBT) and a metal-oxide-semiconductor field-effect transistor (MOSFET) coupled in parallel between a first power switching terminal and a second power switching terminal. The IGBT and the MOSFET are silicon carbide devices. By providing the IGBT and the MOSFET together, a tradeoff between forward conduction current and reverse conduction current of the power module, the efficiency, and the specific current rating of the power module may be improved. Further, providing the IGBT and the MOSFET as silicon carbide devices may significantly improve the performance of the power module.

22 Claims, 11 Drawing Sheets

(51) Int. Cl.
  *H03K 17/76* (2006.01)
  *H01L 29/16* (2006.01)
  *H03K 17/62* (2006.01)

(56) References Cited

U.S. PATENT DOCUMENTS

| | | | | |
|---|---|---|---|---|
| 8,830,711 | B2* | 9/2014 | Lai | H03K 17/168 |
| | | | | 363/98 |
| 9,070,571 | B2* | 6/2015 | Lutz | H01L 29/417 |
| 9,397,657 | B1* | 7/2016 | Zhao | H03K 17/567 |
| 9,419,117 | B2* | 8/2016 | Aketa | H01L 29/7805 |
| 9,640,617 | B2* | 5/2017 | Das | H01L 24/49 |
| 9,722,581 | B2* | 8/2017 | Zhao | H03K 3/012 |
| 10,020,731 | B2* | 7/2018 | Li | H02M 3/158 |
| 10,033,378 | B2* | 7/2018 | Turvey | H03K 17/08142 |
| 10,116,213 | B2* | 10/2018 | Shimizu | H01L 25/07 |
| 10,256,640 | B2* | 4/2019 | Kato | H02J 5/00 |
| 10,333,387 | B2* | 6/2019 | Basler | H01L 23/60 |
| 10,404,188 | B2* | 9/2019 | Saha | H02M 7/53875 |
| 10,475,909 | B2* | 11/2019 | Basler | H01L 29/7393 |
| 10,715,053 | B2* | 7/2020 | Kimura | H02M 7/5387 |
| 2012/0057387 | A1* | 3/2012 | Lai | H02M 7/797 |
| | | | | 363/132 |
| 2013/0257177 | A1* | 10/2013 | Jacobson | H02M 1/08 |
| | | | | 307/115 |
| 2014/0184303 | A1* | 7/2014 | Hasegawa | H03K 17/12 |
| | | | | 327/377 |
| 2018/0269799 | A1* | 9/2018 | Kimura | H02M 7/493 |
| 2018/0269872 | A1 | 9/2018 | Basler et al. | |

OTHER PUBLICATIONS

Infineon FF10R12YT3 datasheet, Oct. 3, 2013, Infineon (Year: 2013).*

Chen, D.Y. et al., "Bipolar-FET Combinational Power Transistors for Power Conversion Applications," IEEE Transactions on Aerospace and Electronic Systems, vol. 20, No. 5, Sep. 1984, IEEE, pp. 659-644.

Deshpande, A. et al., "Practical Design Considerations for a Si IGBT + SiC MOSFET Hybrid Switch: Parasitic Interconnect Influences, Cost, and Current Ratio Optimization," IEEE Transactions on Power Electronics, vol. 34, No. 1, Jan. 2019, IEEE, pp. 724-737.

International Search Report and Written Opinion for International Patent Applicartion No. PCT/US2020/028921, dated Jul. 24, 2020, 16 pages.

* cited by examiner

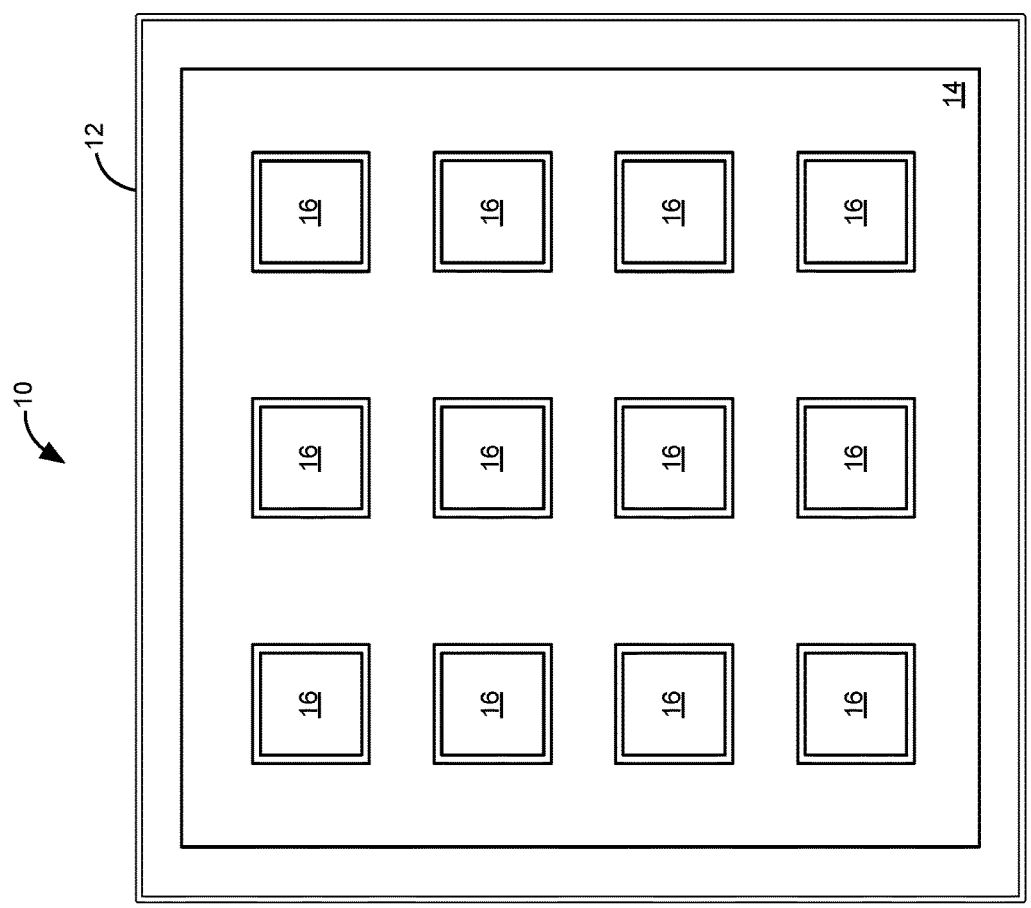

HYBRID POWER MODULE

RELATED APPLICATIONS

This application claims the benefit of provisional patent application Ser. No. 62/866,252, filed Jun. 25, 2019, the disclosure of which is hereby incorporated herein by reference in its entirety.

GOVERNMENT SUPPORT

This invention was made with government funds under contract number N00014-10-D-0145 awarded by the Department of Defense. The U.S. Government has certain rights in the invention.

FIELD OF THE DISCLOSURE

The present disclosure is related to power modules, and in particular power modules including one or more silicon carbide power semiconductor devices.

BACKGROUND

A power module is used to selectively deliver power to and from a load. The primary function of a power module is provided by a number of power semiconductor devices, (e.g., transistors, diodes, etc.) within the power module. These power semiconductor devices are provided as one or more semiconductor die mounted on a power substrate. When provided in a power system with one or more other power modules and/or one or more other components, the power semiconductor devices of a power module may form part of a power converter such as a half-bridge converter, a full-bridge converter, a buck converter, a boost converter, and the like. Power systems often deal with high voltages and currents, and thus the power semiconductor devices of a power module must similarly be capable of reliably switching said high voltages and currents. In recent years, reduced power consumption has become a primary concern in power applications and thus it is desirable for a power module to provide low losses and thus high efficiency. As always, it is desirable to do so at a low cost.

Generally, the one or more power semiconductor devices in a power module form at least one switch position. A typical configuration of a power module allows current to be passed in both a forward direction ($1^{st}$ quadrant conduction) and a reverse direction ($3^{rd}$ quadrant conduction) through the at least one switch position. Conventionally, the power semiconductor devices of a power module have been silicon devices due to well-known processes for producing silicon power semiconductor devices capable of reliably switching high voltages and currents. However, in recent years silicon carbide power semiconductor devices have become popularized due to significant increases in switching speed and efficiency provided thereby. While power modules with silicon carbide power semiconductor devices provide several performance benefits over their silicon counterparts, using silicon carbide power semiconductor devices in a power module presents several challenges in the design thereof such that the design principles applied to power modules including silicon power semiconductor devices do not equally apply to power modules including silicon carbide power semiconductor devices. In short, including silicon carbide power semiconductor devices in a power module is not a matter of simply swapping them for their silicon counterparts in an existing power module.

In light of the above, there is a present need for power modules including silicon carbide power semiconductor devices that are capable of handling high voltages and currents while maintaining high efficiency, a small footprint, and low cost.

SUMMARY

In one embodiment, a power module includes a plurality of power semiconductor devices. The plurality of power semiconductor devices includes an insulated gate bipolar transistor (IGBT) and a metal-oxide-semiconductor field-effect transistor (MOSFET) coupled in parallel between a first power switching terminal and a second power switching terminal. The IGBT and the MOSFET are silicon carbide semiconductor devices. By providing the IGBT and the MOSFET together, a tradeoff between forward conduction current and reverse conduction current of the power module, the efficiency, and the specific current rating of the power module may be improved. Further, providing the IGBT and the MOSFET as silicon carbide devices may significantly improve the performance of the power module.

In one embodiment, a power module includes a plurality of power semiconductor devices. The plurality of power semiconductor devices includes an IGBT and a diode. The IGBT and the diode are coupled in anti-parallel between a first power switching terminal and a second power switching terminal. The IGBT and the diode are silicon carbide semiconductor devices. By providing the IGBT and the diode as silicon carbide semiconductor devices, a performance of the power module may be significantly improved.

In one embodiment, a power module includes a plurality of power semiconductor die. The plurality of power semiconductor die are arranged between a first power switching terminal and a second power switching terminal such that the power module provides a specific current rating of greater than $111064 \times V_{b(r)}^{-0.818}$ A/cm$^2$, where $V_{b(r)}$ is the rated blocking voltage of the power module. The specific current rating is for the active area of the power semiconductor die not including edge termination and inactive structures.

In one embodiment, a method of operating a power module including a silicon carbide IGBT and a silicon carbide MOSFET coupled in parallel includes switching the power module from a forward conduction mode to a blocking mode by placing the IGBT in a blocking mode before placing the MOSFET in a blocking mode and switching the power module from the blocking mode to the forward conduction mode by placing the at least one MOSFET in a reverse conduction mode before placing the at least one IGBT in a forward conduction mode. By operating a power module in this way, switching losses in the power module may be significantly reduced.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a power module according to one embodiment of the present disclosure.

DETAILED DESCRIPTION

Figure 2B:
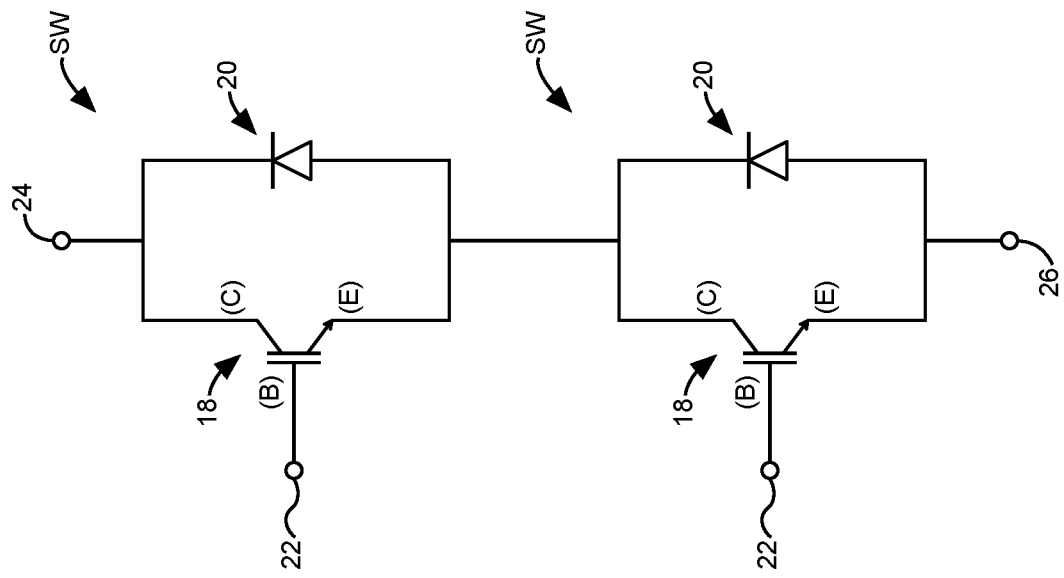
FIGS. 2B and 2C illustrate exemplary arrangements of switch positions of a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a power module 10 according to one embodiment of the present disclosure. The power module 10 includes a housing 12, a power substrate 14 in the housing 12, and a number of power semiconductor die 16 on the power substrate 14. While not shown, the housing 12 may cover the power substrate 14 such that the power substrate 14 is partially or completely enclosed by the housing 12. Further, a number of signal paths formed by traces on the power substrate 14, wirebonds, and contact terminals may connect the power semiconductor die 16 to one another to form a desired topology for the power module 10 as discussed below. Finally, the power substrate 14 may be provided on a baseplate, which is exposed through a bottom of the housing 12. While twelve power semiconductor die 16 are shown in FIG. 1, any number of power semiconductor die 16 may be provided in the power module 10 without departing from the principles of the present disclosure. However, as discussed below, the footprint of the power module 10 is generally limited by standards and practicality, and thus the total number of power semiconductor die 16 that can be provided in the power module 10 may be limited. In various embodiments, the power module 10 may include four power semiconductor die 16, eight power semiconductor die 16, or any other number of power semiconductor die 16.

Figure 2A:
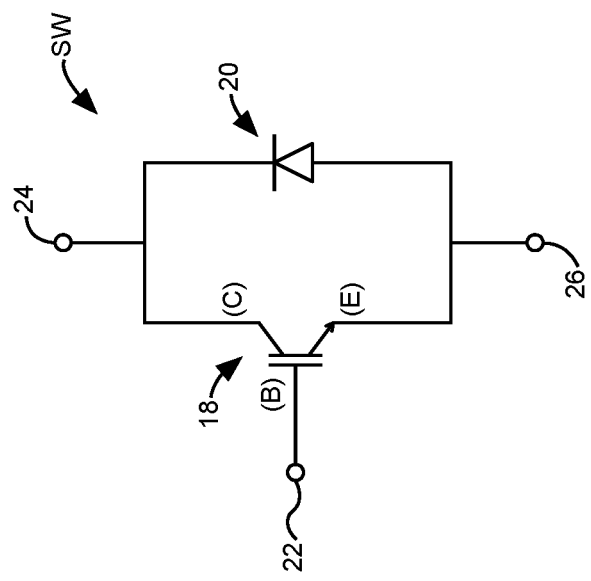
FIG. 2A is a functional schematic illustrating a switch position of a power module according to one embodiment of the present disclosure.

FIG. 2A is a functional schematic illustrating a switch position SW in the power module 10 according to one embodiment of the present disclosure. The switch position SW may include all or a portion of the power semiconductor die 16, which may be coupled together to form a number of power semiconductor devices as shown. In particular, the power semiconductor die 16 may be coupled together to provide an insulated gate bipolar transistor (IGBT) 18 coupled in anti-parallel with a diode 20. The IGBT 18 includes a base contact (B) coupled to a control terminal 22, a collector contact (C) coupled to a first power switching terminal 24, and an emitter contact (E) coupled to a second power switching terminal 26. The diode 20 includes an anode coupled to the second power switching terminal 26 and a cathode coupled to the first power switching terminal 24.

The IGBT 18 may be provided by a number of the power semiconductor die 16, each of which are IGBT semiconductor die, coupled in parallel. Similarly, the diode 20 may be provided by a number of the power semiconductor die 16, each of which are diode semiconductor die, coupled in parallel. The number of semiconductor die 16 used for the IGBT 18 may be different from the number of semiconductor die 16 used for the diode 20 (e.g., depending on the current carrying capacity of each device). Each one of the power semiconductor die 16 may be rated for a certain blocking voltage and a certain forward conduction current. Providing multiple power semiconductor die 16 for each one of the IGBT 18 and the diode 20 increases the forward conduction current thereof (by an integer multiple for each additional power semiconductor die 16). Accordingly, the switch position SW may be capable of blocking high voltages and conducting high currents, both in the forward direction (from the first power switching terminal 24 to the second power switching terminal 26) through the IGBT 18 and the reverse direction (from the second power switching terminal 26 to the first power switching terminal 24) through the diode 20.

Figure 2C:
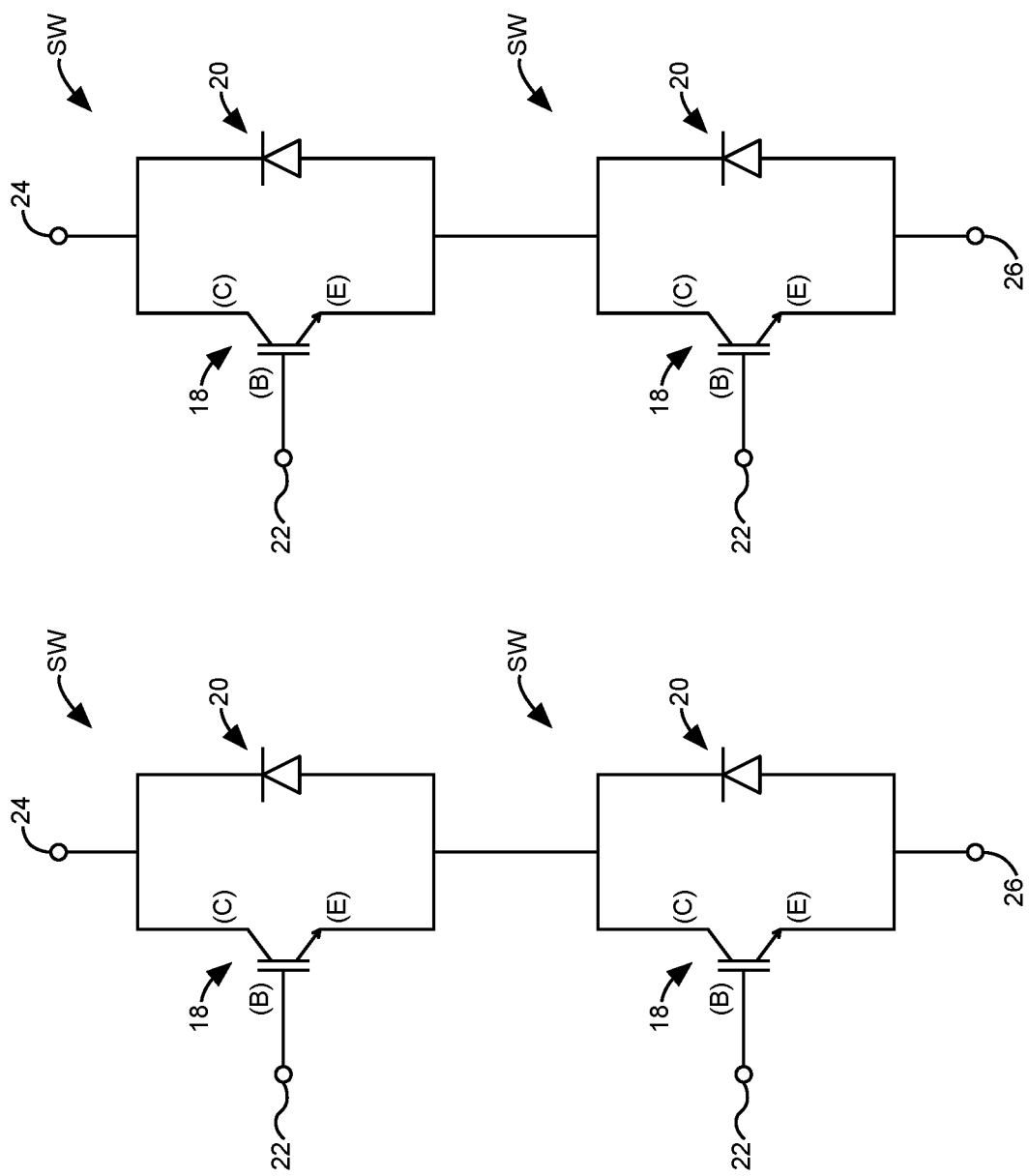

In some embodiments, the power module 10 may include multiple switch positions SW. The switch positions SW may be coupled together in series or parallel between the first power switching terminal 24 and the second power switching terminal 26, depending on the application of the power module 10. In some embodiments, the switch positions SW may not be coupled together at all. For example, FIG. 2B shows two switch positions SW coupled in series, which may be used to form the switching portion of a half-bridge power converter. FIG. 2C shows four switch positions SW, wherein two pairs of the four switch positions SW are coupled in series. The two pairs of series coupled switch positions SW may be coupled in parallel to form the switching portion of a full-bridge power converter, or may be left uncoupled. Notably, the power module 10 may provide any number of switch positions SW arranged in any desired manner.

In one embodiment, the IGBT 18 and the diode 20 are silicon carbide semiconductor devices. Providing the IGBT 18 and the diode 20 as silicon carbide devices may provide several performance benefits to the power module 10, such as increased blocking voltage, forward conduction current, and reverse conduction current, as well as decreased switching and conduction losses as compared to a conventional power module of the same size. For example, the power module 10 may be capable of blocking voltages greater than 1 kV between the first power switching terminal 24 and the second power switching terminal 26 in a blocking mode of operation. In various embodiments, the power module 10 may be capable of blocking voltages greater than 2 kV, greater than 3 kV, greater than 4 kV, greater than 5 kV, greater than 6 kV, greater than 7 kV, greater than 8 kV, greater than 9 kV, greater than 10 kV, greater than 11 kV, greater than 12 kV, greater than 13 kV, greater than 14 kV, greater than 15 kV, greater than 16 kV, greater than 17 kV, greater than 18 kV, greater than 19 kV, greater than 20 kV, greater than 21 kV, greater than 22 kV, greater than 23 kV, greater than 24 kV, greater than 25 kV, and up to 26 kV. The blocking voltage of the power module 10 may further be expressed as a range with any of the above blocking voltages as a starting point and end point. For example, the power module 10 may be capable of blocking voltages between 2 kV and 26 kV, between 10 kV and 26 kV, between 20 kV and 26 kV, between 2 kV and 12 kV, between 10 kV and 15 kV, between 11 kV and 26 kV, and the like. For the above blocking voltages, a forward conduction current (between the first power switching terminal 24 and the second power switching terminal 26) and a reverse conduction current (between the second power switching terminal 26 and the first power switching terminal 24) depends on the area of the semiconductor die, and thus the number of power semiconductor die 16, devoted to each one of the IGBT 18 and the diode 20, respectively.

Figure 3:
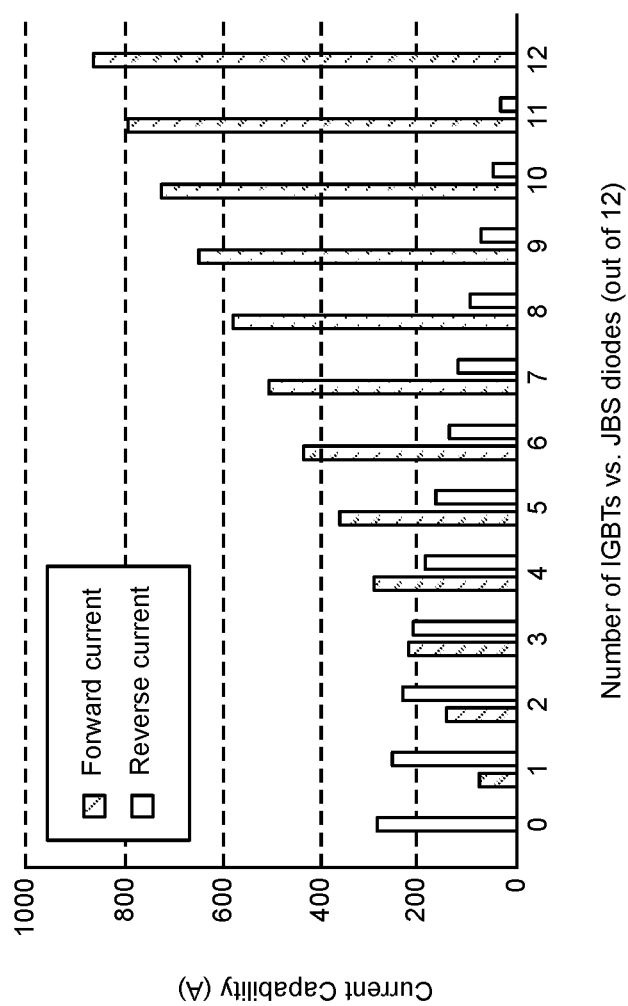
FIG. 3 is a graph illustrating a relationship between forward conduction current and reverse conduction current of a power module according to one embodiment of the present disclosure.

FIG. 3 is a graph illustrating the forward conduction current and reverse conduction current for the power module 10 based on the number of power semiconductor die 16 utilized for the IGBT 18 versus the number of power semiconductor die 16 utilized for the diode 20. As shown, a maximum reverse conduction current occurs when all twelve of the power semiconductor die 16 are used for the diode 20. However, the power module 10 is not capable of providing a forward conduction current in this scenario. As the number of power semiconductor die 16 used for the IGBT 18 increases, the forward conduction current of the power module 10 similarly increases, and the reverse conduction current of the power module 10 decreases. The power module 10 is capable of blocking the voltages discussed above in any of the scenarios illustrated in FIG. 3 and thus is capable of both forward and reverse conduction currents greater than 200 A as well as the other illustrated scenarios. In various embodiments, the power module is capable of providing forward and reverse conduction currents in the range of 100 A to 6 kA, 150 A to 6 kA, 200 A to 6 kA, 250 A to 6 kA, 300 A to 6 kA, 500 A to 6 kA, 1 kA to 6000 kA, and any subranges formed by any of the above ranges. In the exemplary situation described by the graph in FIG. 3, the forward conduction current and the reverse conduction current of the power module 10 are relatively equal when three of the twelve power semiconductor die 16 are used for the IGBT 18 and the remaining nine of the twelve power semiconductor die 16 are used for the diode 20.

As discussed above, the footprint of the power module 10 is limited both by standards and practicality. For the same footprint, the power module 10 can achieve far greater blocking voltages with the above forward conduction currents and reverse conduction currents than a power module wherein the power semiconductor devices are silicon.

As illustrated above, a tradeoff exists between forward conduction current and reverse conduction current in the power module 10. Because the footprint of the power module 10 is limited, the achievable forward and reverse conduction currents of the power module 10 are similarly limited by the space available for the power semiconductor die 16. This is because the amount of current that can be passed by the IGBT 18 (forward conduction current) is a function of the area of semiconductor die devoted to the IGBT 18 and, similarly, the amount of current that can be passed by the diode 20 (reverse conduction current) is a function of the area of semiconductor die devoted to the diode 20. In some embodiments, the diode 20 may be a junction barrier Schottky (JBS) diode. Accordingly, for a given area of semiconductor die the diode 20 may conduct far less current than the IGBT 18, thereby requiring far more area of semiconductor die (and thus number of the power semiconductor die 16) to be devoted to the diode 20 than to the IGBT 18 to achieve a desired reverse conduction current. Since to total number of power semiconductor die 16 is limited by the footprint of the power module 10, the forward conduction current and reverse conduction current of the power module 10 are also limited. While the power module 10 described above is capable of achieving higher blocking voltages, forward conduction currents, and reverse conduction currents than previously attainable, it is always desirable to further increase the forward conduction current and reverse conduction current of the power module 10.

Figure 4:
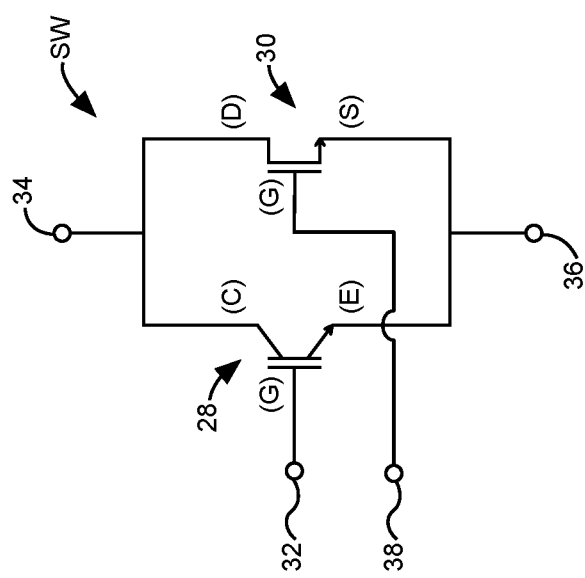
FIG. 4 is a functional schematic illustrating a switch position of a power module according to one embodiment of the present disclosure.

FIG. 4 is a functional schematic illustrating a switch position SW in the power module 10 according to an additional embodiment of the present disclosure. The switch position SW may include all or a portion of the power semiconductor die 16, which may be coupled together to form a number of power semiconductor devices as shown. In particular, the power semiconductor die 16 may be coupled together to provide an IGBT 28 and a metal-oxide-semiconductor field-effect transistor (MOSFET) 30. The IGBT 28 includes a gate contact (G) coupled to a first control terminal 32, a collector contact (C) coupled to a first power switching terminal 34, and an emitter contact (E) coupled to a second power switching terminal 36. The MOSFET 30 includes a gate contact (G) coupled to a second control terminal 38, a drain contact (D) coupled to the first power switching terminal 34, and a source contact (S) coupled to the second power switching terminal 36.

The IGBT 28 may be provided by a number of the power semiconductor die 16, each of which are IGBT semiconductor die, coupled in parallel. Similarly, the MOSFET 30 may be provided by a number of the power semiconductor die 16, each of which are MOSFET semiconductor die, coupled in parallel. In one embodiment, one or more of the semiconductor die 16 provide both IGBT and MOSFET devices on the same die, either discretely (i.e., not electrically coupled on the die itself), or integrated with one another in any desired manner. Each one of the power semiconductor die 16 may be rated for a certain blocking voltage and a certain forward conduction current. Providing multiple power semiconductor die for each one of the IGBT 28 and the MOSFET 30 increases the forward conduction current thereof (by an integer multiple for each additional power semiconductor die 16). Accordingly, the switch position SW may be capable of blocking high voltages and conducting high currents, both in the forward direction (from the first power switching terminal 34 to the second power switching terminal 36) and the reverse direction (from the second power switching terminal 36 to the first power switching terminal 34).

As discussed above, in some embodiments the power module 10 may include multiple switch positions SW. The switch positions SW may be coupled in series or parallel between the first power switching terminal 34 and the second power switching terminal 36, depending on the application of the power module 10. In some embodiments, the switch positions SW may not be coupled together at all.

In one embodiment, the IGBT 28 and the MOSFET 30 are silicon carbide semiconductor devices. Providing the IGBT 28 and the MOSFET 30 as silicon carbide devices may provide several performance benefits to the power module 10, such as increased blocking voltage, forward conduction current, and reverse conduction current, as well as decreased switching and conduction losses as compared to a conventional power module. For example, the power module 10 may be capable of blocking voltages greater than 1 kV between the first power switching terminal 34 and the second power switching terminal 36. In various embodiments, the power module 10 may be capable of blocking voltages greater than 2 kV, greater than 3 kV, greater than 4 kV, greater than 5 kV, greater than 6 kV, greater than 7 kV, greater than 8 kV, greater than 9 kV, greater than 10 kV, greater than 11 kV, greater than 12 kV, greater than 13 kV, greater than 14 kV, greater than 15 kV, greater than 16 kV, greater than 17 kV, greater than 18 kV, greater than 19 kV, greater than 20 kV, greater than 21 kV, greater than 22 kV, greater than 23 kV, greater than 24 kV, greater than 25 kV, and up to 26 kV. The blocking voltage of the power module 10 may further be expressed as a range with any of the above blocking voltages as a starting point and end point. For example, the power module 10 may be capable of blocking voltages between 2 kV and 26 kV, between 10 kV and 26 kV, between 20 kV and 26 kV, between 2 kV and 12 kV, between 10 kV and 15 kV, between 11 kV and 26 kV, and the like. For the above blocking voltages, a forward conduction current (between the first power switching terminal 34 and the second power switching terminal 36) and a reverse conduction current (between the second power switching terminal 36 and the first power switching terminal 34) depends on the area of semiconductor die, and thus the number of power semiconductor die 16, devoted to each one of the IGBT 28 and the MOSFET 30.

Figure 5:
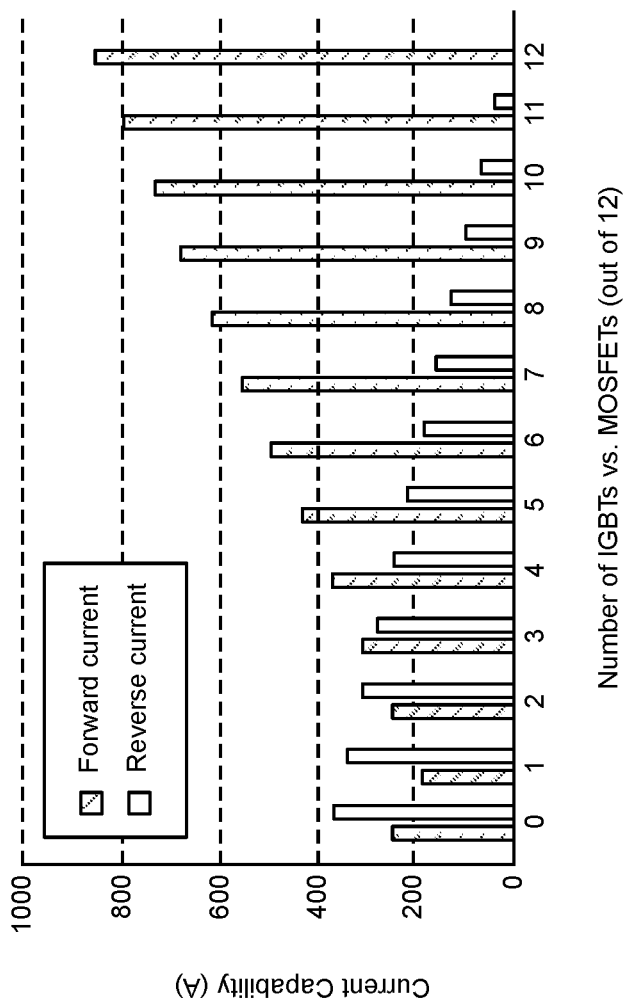
FIG. 5 is a graph illustrating a relationship between forward conduction current and reverse conduction current of a power module according to one embodiment of the present disclosure.

FIG. 5 is a graph illustrating the forward conduction current and reverse conduction current for the power module 10 based on the number of power semiconductor die 16 utilized for the IGBT 28 versus the number of power semiconductor die 16 utilized for the MOSFET 30. In the exemplary situation illustrated by the graph in FIG. 5, a maximum reverse conduction current occurs when all twelve of the power semiconductor die 16 are used for the MOSFET 30. While the power module 10 is still capable of a forward conduction current in this scenario, the tradeoff between reverse conduction current and forward conduction current can be improved by introducing one or more IGBTs. As the number of power semiconductor die 16 used for the IGBT 28 increases, the forward conduction current of the power module 10 similarly increases, and the reverse conduction current of the power module 10 decreases. The power module 10 is capable of blocking the voltages discussed above in any of the scenarios illustrated in FIG. 3 and thus is capable of forward and reverse conduction currents greater than 250 A as well as the other illustrated scenarios. In various embodiments, the power module is capable of providing forward and reverse conduction currents in the range of 100 A to 6 kA, 150 A to 6 kA, 200 A to 6 kA, 250 A to 6 kA, 300 A to 6 kA, 500 A to 6 kA, 1 kA to 6 kA, and any subranges formed by any of the above ranges. The forward conduction current and the reverse conduction current of the power module 10 are relatively equal when three of the twelve power semiconductor die 16 are used for the IGBT 28 and the remaining nine of the twelve power semiconductor die 16 are used for the MOSFET 30.

As discussed above, the footprint of the power module 10 is limited. For the same footprint, the power module 10 can achieve far greater blocking voltages with the above forward conduction currents and reverse conduction currents than a power module wherein the devices are silicon. Further, the power module 10 discussed with respect to FIGS. 4 and 5 can achieve a higher forward conduction current for the same reverse conduction current than the power module 10 discussed with respect to FIGS. 2 and 3.

As discussed above, a tradeoff exists between forward conduction current and reverse conduction current in the power module 10. Because the footprint of the power module 10 is limited by standards and practicality, the achievable forward and reverse conduction currents of the power module are similarly limited by the space available for the power semiconductor die 16. This is because the amount of current that can be passed by the IGBT 28 (forward conduction current) is a function of the area of semiconductor die devoted to the IGBT 28 and, similarly, the amount of current that can be passed by the MOSFET 30 (both forward conduction current and reverse conduction current) is a function of the area of semiconductor die devoted to the MOSFET 30. MOSFETs pass more current in the reverse direction (source to drain) than JBS diodes (anode to cathode) for the same area of semiconductor die. Further, MOSFETs are capable of passing current bidirectionally (source to drain and drain to source) due to an internal body diode thereof. IGBTs pass more current in the forward direction (collector to emitter) than MOSFETs (drain to source) for the same area of semiconductor die. Accordingly, using the IGBT 28 and the MOSFET 30 in the switch position SW of the power module 10 allows for a better tradeoff between forward conduction current and reverse conduction current than was previously achievable. In one embodiment, the power module 10 provides a specific current rating as measured in Amperes per square centimeter (A/cm2) of greater than $111064 \times V_{b(r)}^{-0.818}$ A/cm$^2$, where $V_{b(r)}$ is the rated blocking voltage of the power module. In one embodiment, the specific current rating applies both in the forward and reverse directions.

Figure 6:
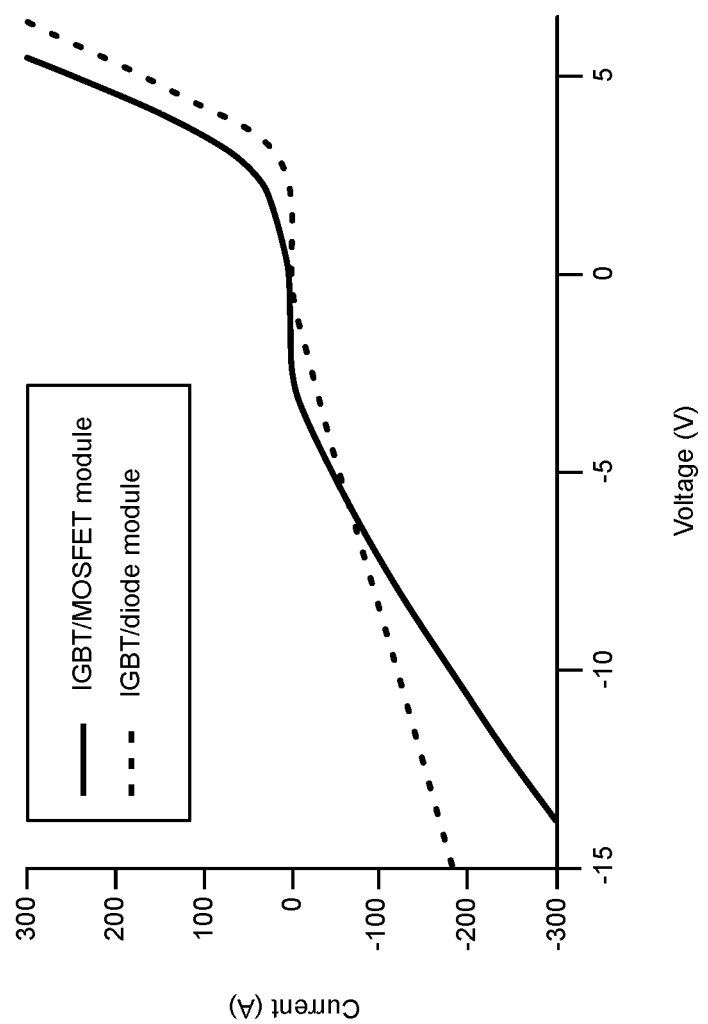
FIG. 6 is a graph illustrating a power output of a power module according to various embodiments of the present disclosure.

In addition to a better tradeoff between forward conduction current and reverse conduction current, using the IGBT 28 and the MOSFET 30 in the switch position SW of the power module 10 increases an efficiency of the power module 10 as illustrated by FIG. 6. As shown, the power module 10 including the IGBT 28 and the MOSFET 30 provides significantly higher DC efficiency than its counterpart power module 10 including the IGBT 18 and the diode 20 discussed above, especially in light-load conditions. While not shown, both of the embodiments of the power module 10 discussed above significantly outperform power modules including only MOSFETs as well as conventional power modules utilizing silicon devices in their efficiency.

As shown in FIG. 4, the switch position SW has the first control terminal 32 and the second control terminal 38. Providing separate control terminals for the IGBT 28 and the MOSFET 30 may allow for several performance benefits to be realized by the power module 10. In particular, the IGBT 28 and the MOSFET 30 may be individually controlled (e.g., by switching control signals from switching control circuitry, which is not shown) such that switching control schemes may be used that minimize switching losses in the power module 10.

Figure 7:
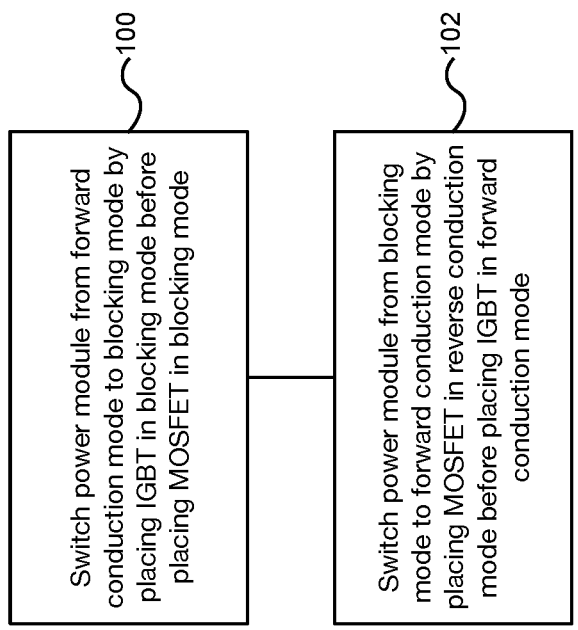
FIG. 7 is a flow diagram illustrating a method of operating a power module according to one embodiment of the present disclosure.

FIG. 7 is a flow diagram illustrating a method for controlling the IGBT 28 and the MOSFET 30 in the power module 10 to minimize switching losses according to one embodiment of the present disclosure. First, the power module 10 may be switched from a forward conduction mode in which current is conducted between the first power switching terminal 34 and the second power switching terminal 36 to a blocking mode in which current is not conducted between the first power switching terminal 34 and the second power switching terminal 36 by placing the IGBT 28 in a blocking mode before placing the MOSFET 30 in a blocking mode (step 100). Placing the IGBT 28 in a blocking mode before the MOSFET 30 reduces switching losses in the power module 10, since the IGBT 28 generally takes much longer to transition from a forward conduction mode to a blocking mode due to the recombination time of minority carriers in the device.

Second, the power module 10 may be switched from the blocking mode to the forward conduction mode by placing the MOSFET 30 in a reverse conduction mode prior to placing the IGBT 28 in a forward conduction mode (step 102). Placing the MOSFET 30 in a reverse conduction mode before placing the IGBT 28 in a forward conduction mode mitigates reverse recovery loss by allowing charge to recombine rather than being swept out of the drift region by the reverse recovery process, thereby reducing switching losses in the power module 10.

Figure 8:
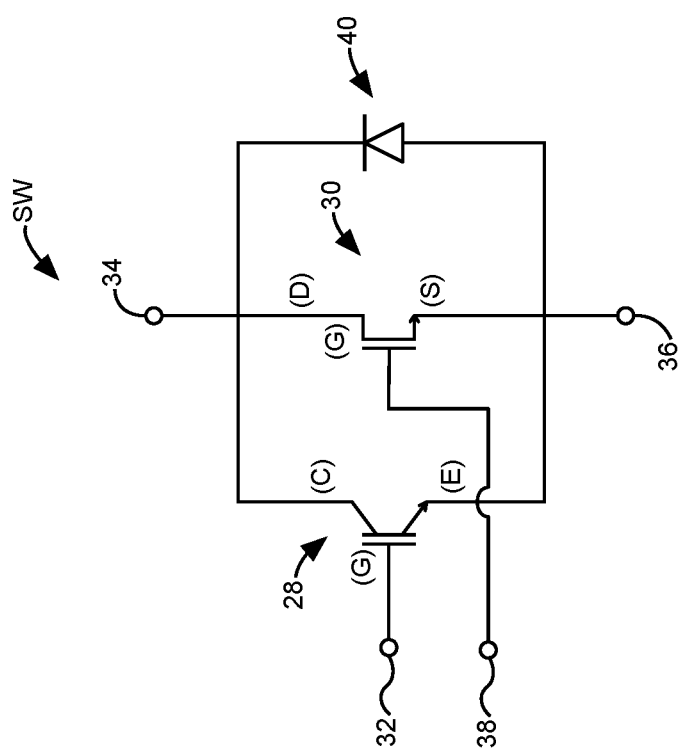
FIG. 8 is a functional schematic illustrating a switch position of a power module according to one embodiment of the present disclosure.

In some embodiments, it may be desirable to also include a diode in the switch position SW discussed above with respect to FIG. 4. Accordingly, FIG. 8 is a functional schematic illustrating the switch position SW according to an alternative embodiment in which a diode 40 is provided in parallel with the IGBT 28 and the MOSFET 30. In particular, the diode 40 includes an anode contact coupled to the second power switching terminal 36 and a cathode coupled to the first power switching terminal 34. The diode 40 may be provided by any number of the power semiconductor die 16 coupled in parallel as discussed above.

Figure 9:
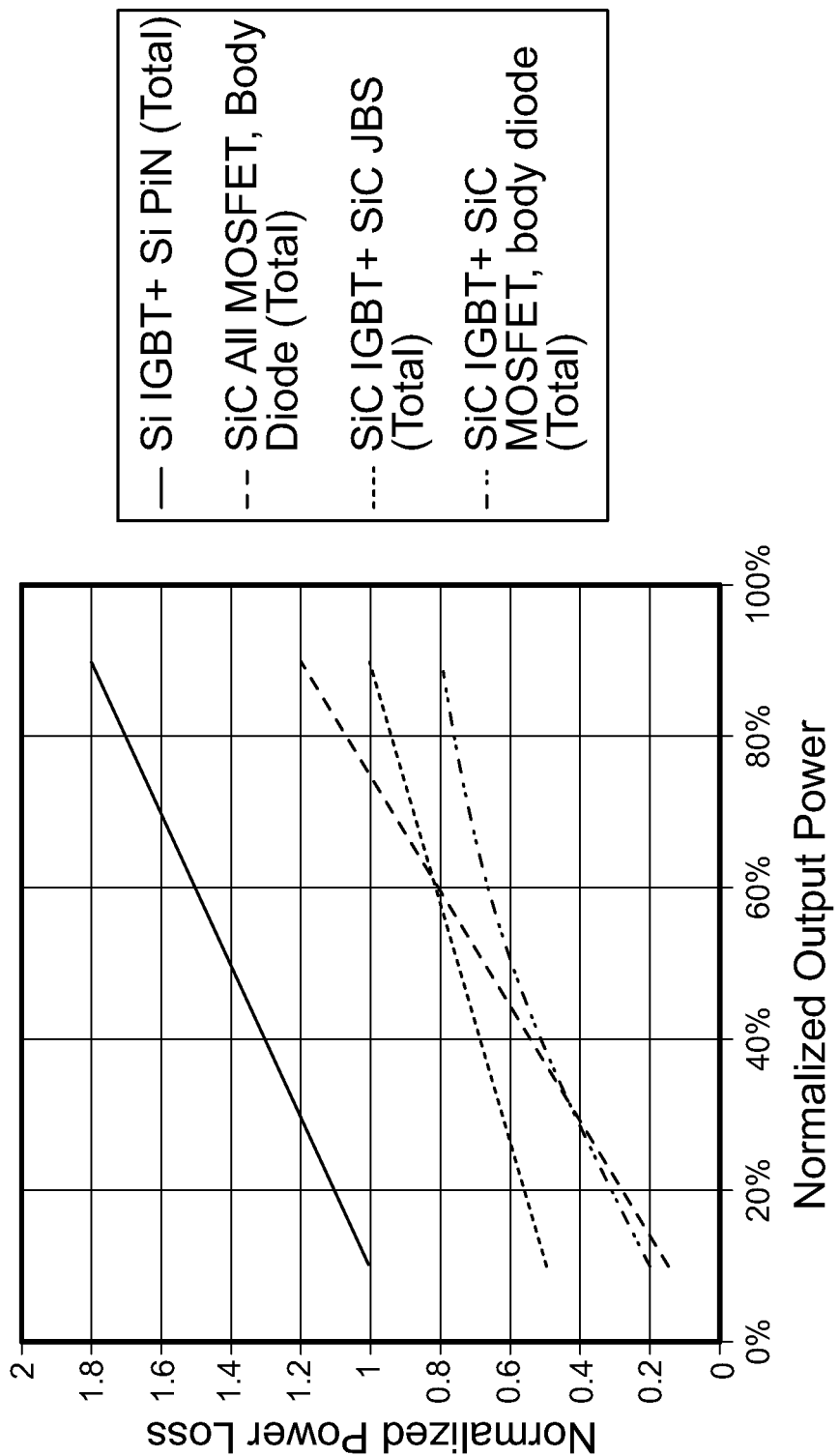
FIG. 9 is a graph illustrating a normalized output power vs a normalized power loss for a number of power modules according to various embodiments of the present disclosure.

FIG. 9 is a graph illustrating a normalized output power vs. normalized power loss for a conventional power module wherein the switch positions are formed by a number of silicon IGBTs and silicon PiN diodes (solid line), a power module wherein the switch positions are formed by a number of silicon carbide MOSFETs using the internal body diodes thereof for reverse current conduction (wide dashed line), a power module 10 according to one embodiment of the present disclosure wherein the switch positions are formed by a number of silicon carbide IGBTs and silicon carbide JBS diodes (narrow dashed line), and a power module 10 according to one embodiment of the present disclosure wherein the switch positions are formed by a number of silicon carbide IGBTs and a number of silicon carbide MOSFETs (dashed and dotted line). As shown, all of the power modules utilizing silicon carbide provide far less loss than the power module utilizing silicon. Further, the power module using silicon carbide IGBTs and JBS diodes provides much lower losses at low output power than the power module using only silicon carbide MOSFETs. The lowest overall losses are provided by the power module using IGBTs and MOSFETs as discussed herein.

Figure 10:
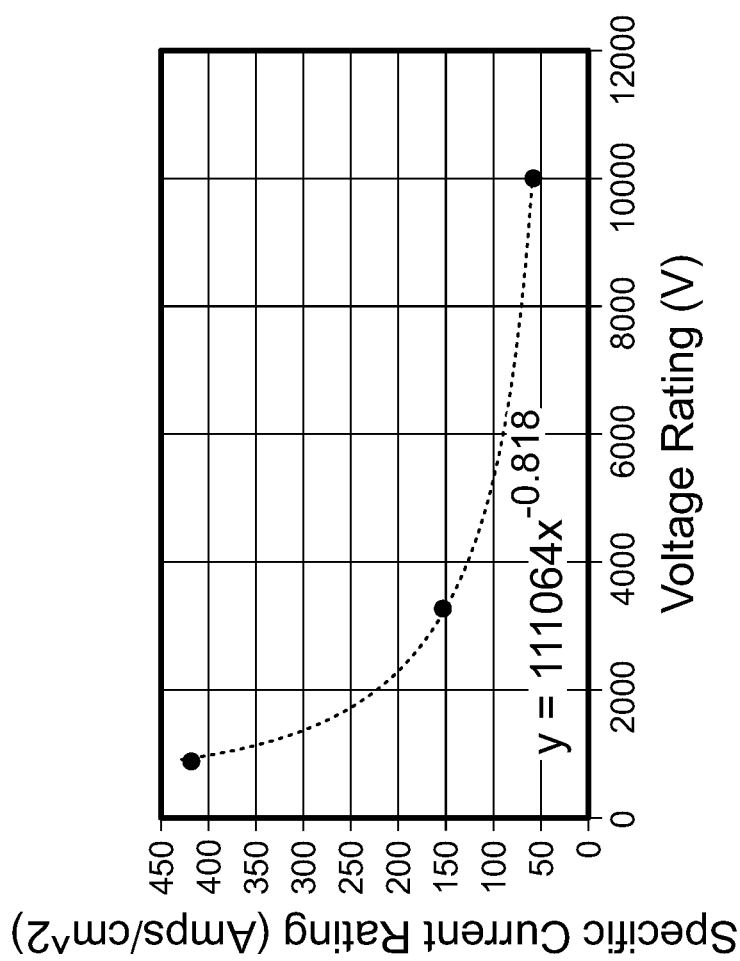
FIG. 10 is a graph illustrating a relationship between a specific current rating and a voltage rating of a power module according to one embodiment of the present disclosure.

FIG. 10 is a graph illustrating a specific current rating in Amperes per centimeter squared (A/cm$^2$) of the power module 10. As shown, the specific current rating of the power module 10 decreases as the voltage rating of the power module 10 increases. In one embodiment, the specific current rating of the power module is greater than $111064 \times V_{b(r)}^{-0.818}$ A/cm$^2$, where $V_{b(r)}$ is the rated blocking voltage of the power module.

Those skilled in the art will recognize improvements and modifications to the preferred embodiments of the present disclosure. All such improvements and modifications are considered within the scope of the concepts disclosed herein and the claims that follow.

What is claimed is:

1. A power module comprising:
a first power switching terminal and a second power switching terminal; and
a plurality of power semiconductor devices, the plurality of power semiconductor devices comprising:
at least one insulated gate bipolar transistor (IGBT); and
at least one metal-oxide-semiconductor field-effect transistor (MOSFET), wherein:
the at least one IGBT and the at least one MOSFET are coupled in parallel between the first power switching terminal and the second power switching terminal;
the at least one IGBT and the at least one MOSFET are silicon carbide semiconductor devices; and
the at least one IGBT and the at least one MOSFET are independently controllable.

2. The power module of claim 1 wherein:
a collector contact of the at least one IGBT and a drain contact of the at least one MOSFET are coupled to the first power switching terminal; and
an emitter contact of the at least one IGBT and a source contact of the at least one MOSFET are coupled to the second power switching terminal.

3. The power module of claim 2 further comprising:
a first switching control terminal coupled to a gate contact of the at least one IGBT; and
a second switching control terminal coupled to a gate contact of the at least one MOSFET.

4. The power module of claim 1 further comprising:
a first switching control terminal coupled to a gate contact of the at least one IGBT; and
a second switching control terminal coupled to a gate contact of the at least one MOSFET.

5. The power module of claim 1 wherein the at least one IGBT comprises a plurality of IGBT semiconductor die.

6. The power module of claim 5 wherein the at least one MOSFET comprises a plurality of MOSFET semiconductor die.

7. The power module of claim 1 wherein the at least one MOSFET comprises a plurality of MOSFET semiconductor die.

8. The power module of claim 1 further comprising at least one diode coupled in anti-parallel with the at least one IGBT and the at least one MOSFET between the first power switching terminal and the second power switching terminal.

9. The power module of claim 8 wherein the at least one diode is a silicon carbide semiconductor device.

10. The power module of claim 8 wherein:
a collector contact of the at least one IGBT, a drain contact of the at least one MOSFET, and a cathode of the at least one diode are coupled to the first power switching terminal; and
an emitter contact of the at least one IGBT, a source contact of the at least one MOSFET, and an anode of the at least one diode are coupled to the second power switching terminal.

11. The power module of claim 1 wherein a specific current rating of the power module is greater than $111064 \times V_{b(r)}^{-0.818}$ A/cm$^2$, where $V_{b(r)}$ is the rated blocking voltage of the power module.

12. The power module of claim 1 wherein the at least one IGBT comprises a number of IGBT semiconductor die and the at least one MOSFET comprises a number of MOSFET semiconductor die that is greater than the number of IGBT semiconductor die.

13. A power module comprising:
a first power switching terminal and a second power switching terminal; and
a plurality of power semiconductor devices, the plurality of power semiconductor devices comprising:
at least one insulated gate bipolar transistor (IGBT);
at least one metal-oxide-semiconductor field-effect transistor (MOSFET); and
at least one diode, wherein:
the at least one IGBT comprises a number of IGBT semiconductor die and the at least one diode comprises a different number of diode semiconductor die than the number of IGBT semiconductor die;
the at least one MOSFET comprises a number of MOSFET semiconductor die that is greater than the number of IGBT semiconductor die;
the at least one IGBT and the at least one diode are coupled in anti-parallel between the first power switching terminal and the second power switching terminal; and
the at least one IGBT, the at least one MOSFET, and the at least one diode are silicon carbide semiconductor devices.

14. The power module of claim 13 wherein:
a collector contact of the at least one IGBT and a cathode of the at least one diode are coupled to the first power switching terminal; and
an emitter contact of the at least one IGBT and an anode contact of the at least one diode are coupled to the second power switching terminal.

15. The power module of claim 14 wherein the at least one diode is a junction barrier Schottky diode.

16. The power module of claim 13 wherein the at least one IGBT comprises a plurality of IGBTs.

17. The power module of claim 16 wherein the at least one diode comprises a plurality of diodes.

18. A power module comprising:
a first power switching terminal, a second power switching terminal, and a control terminal; and
a plurality of semiconductor die arranged in parallel between the first power switching terminal, the second power switching terminal, and the control terminal such that:
the power module is configured to independently control the plurality of semiconductor die and selectively conduct current between the first power switching terminal and the second power switching terminal based on control signals provided at the control terminal; and
a specific current rating of the power module in both forward current and reverse current directions is greater than $111064 \times V_{b(r)}^{-0.818}$ A/cm$^2$, where $V_{b(r)}$ is the rated blocking voltage of the power module.

19. The power module of claim 18 wherein the plurality of semiconductor die are silicon carbide semiconductor devices.

20. The power module of claim 18 wherein the plurality of semiconductor die comprise at least one silicon carbide insulated gate bipolar transistor (IGBT) and at least one metal-oxide-semiconductor field-effect transistor (MOSFET).

21. A method of operating a power module comprising at least one silicon carbide insulated gate bipolar transistor (IGBT) and at least one silicon carbide metal-oxide-semiconductor field-effect transistor (MOSFET) coupled in parallel, the method comprising:

independently switching the power module from a forward conduction mode to a blocking mode by placing the at least one IGBT in a blocking mode before placing the at least one MOSFET in a blocking mode; and independently switching the power module from the blocking mode to the forward conduction mode by placing the at least one MOSFET in a reverse conduction mode before placing the at least one IGBT in a forward conduction mode.

22. The method of claim 21 wherein the at least one IGBT comprises a number of IGBT semiconductor die and the at least one MOSFET comprises a different number of MOSFET semiconductor die than the number of IGBT semiconductor die.

\* \* \* \* \*